United States Patent [19]
Van Aken

[11] Patent Number: 5,581,485
[45] Date of Patent: Dec. 3, 1996

[54] ANALOG VECTOR DISTANCE MEASURING AND VECTOR QUANTIZATION ARCHITECTURE

[75] Inventor: Philip A. Van Aken, Saratoga, Calif.

[73] Assignee: Omni Microelectronics, Inc., Santa Clara, Calif.

[21] Appl. No.: 353,035

[22] Filed: Dec. 8, 1994

[51] Int. Cl.$^6$ .............................. G01B 1/00; G06G 7/22; G11C 27/00

[52] U.S. Cl. .......................... 364/561; 364/807; 364/815; 365/45; 365/220; 365/230.03

[58] Field of Search .................................. 364/815, 561, 364/807; 348/422; 365/45, 63, 185.01, 185.03, 189.01, 220, 230.03

[56] References Cited

U.S. PATENT DOCUMENTS

| | | | |
|---|---|---|---|
| 4,393,370 | 7/1983 | Hareyama | 340/347 DA |
| 4,904,881 | 2/1990 | Castro | 307/201 |
| 4,933,906 | 6/1990 | Terada et al. | 365/208 |
| 4,999,812 | 3/1991 | Amin | 365/185 |
| 5,023,833 | 6/1991 | Baum et al. | 365/49 |
| 5,040,134 | 8/1991 | Park | 364/602 |
| 5,256,911 | 10/1993 | Holler et al. | 307/201 |
| 5,325,325 | 6/1994 | Azuma | 365/156 |
| 5,371,706 | 12/1994 | Krentz et al. | 365/201 |
| 5,438,293 | 8/1995 | Guerrieri et al. | 327/355 |

Primary Examiner—James P. Trammell
Assistant Examiner—Hien Vo
Attorney, Agent, or Firm—Skjerven, Morrill, MacPherson, Franklin & Friel; Alan H. MacPherson; David T. Millers

[57] ABSTRACT

A distance measuring circuit includes an array of non-volatile analog storage cells arranged in rows and columns, input circuits to apply complementary analog voltages to pairs of row lines, and current measurement circuits connected to the column lines. Pairs of storage cells in a column are programmed to threshold voltages linearly related to a component of a stored vector and the negative of the component of the stored vector. During distance measurement, input voltages on a corresponding pair of the row lines are similarly linear related to a corresponding component of an input vector and the additive inverse of the component of the input vector. The storage cells are biased in the saturation regions so that the current through each storage cell is approximately proportional to the square of the difference between the voltage on the row line and the cell's threshold voltage, and currents on the column lines indicate the squared distance between user stored analog vectors and the input analog vector.

14 Claims, 8 Drawing Sheets

ANALOG VECTOR DISTANCE MEASURING AND VECTOR QUANTIZATION ARCHITECTURE

BACKGROUND OF THE INVENTION

1. Field of the Invention

This invention relates to circuits for measuring distance between vectors, and in particular to a distance measuring array of analog storage cells, which is applicable to various applications including vector quantization and pattern recognition.

2. Description of Related Art

Vectors are well known mathematical constructs which have nearly limitless applications to physical systems. Mathematically, a vector has a magnitude and a direction and is typically represented by a set of components. A Euclidean distance between a first vector and a second vector can be defined as the squareroot of the sum of the squares of the differences between the components of the first vector and the corresponding components of the second vector. If the two vectors are equal, each component of the first vector equals the corresponding component of a second vector, and the Euclidean distance between the vectors is zero.

Physical quantities represented by vectors are commonly indicated in circuits, by parallel signals where each signal indicates a component of a vector. For example, a sound can be periodically sampled to create a vector having components which are sound amplitudes distinguished by a time index. Alternatively, a sound can be filtered and decomposed into frequency components that represent components of a discrete Fourier transform. Each component can be represented by an analog signal or by a multi-bit digital signal. In the following, the term vector, when used in the context of a physical system, refers to a set of signals which represent vector components.

Many physical systems, such as systems which perform vector quantization, pattern recognition, pattern matching, and data compression measure the distance between vectors. Digital processing for distance measurement is known. Such digital processing often requires an analog-to-digital converter which digitizes analog signals representing the vector components before a general purpose processor or a special purpose integrated circuit determines the distance between two vectors. Determining a distance with a general purpose processor typically requires many clock cycles and in a system that processes vectors in real time, can create a bottle neck because often each vector has many components and there are many pair of vectors to be compared. Special purpose circuits can be faster at determining distances than are general purpose processors, but prior art special purpose circuits tend to be complicated and increase the size and cost of a system.

A simple distance measuring circuit is needed which can operate directly on analog vector components and provide a signal indicating the distance between the vectors.

BRIEF DESCRIPTION OF THE INVENTION

In accordance with this invention, a distance measuring circuit includes an array of floating-gate storage cells, input circuits which apply complementary analog voltages to row lines of the array, and circuits for measuring current in column lines of the array. The distance measuring circuit can stand alone as an integrated circuit with programming and other signals coming from outside, or the distance measuring circuit can be incorporated in an integrated circuit also containing circuitry such as a preprocessor or a post-processor.

Before measuring a distance between vectors, a user programs the threshold voltages of a first set of storage cells in the array, to levels which are linearly related to components of a vector being stored. The threshold voltages of a second set of storage cells are programmed to reciprocal levels which are linearly related to the negatives of the vector components being stored. In one embodiment of this invention, the first and second sets of cells are in a column of the array, and each column in the array is programmed to represent a different stored vector. The array may contain a library of prototype vectors.

During distance measurement, analog voltages linearly related to the magnitudes of components of an input vector are asserted in parallel to row lines connected to the first set of storage cells. The row lines cross the columns of the array and are attached to the control gates of the floating-gate storage cells in rows of the array. A cell in the first set of cells in a column conducts if the control gate voltage which corresponds to a component of the input vector is greater than the cell's threshold voltage which corresponds to a component of the stored vector. Otherwise, cells in the first set do not conduct.

Analog inverters generate voltages linearly related to the negatives of the components of the input vector and assert the generated voltages to the row lines coupled to the control gates of the second sets of cells. Lower vector components cause higher control gate voltages. A cell in a second set conducts if the component corresponding to the cell's control gate voltage is less than the component corresponding to the cell's threshold voltage.

During distance measurement, the analog storage cells are biased in the saturation region, so that when a control gate voltage applied to a cell exceeds that cell's threshold voltage, the cell conducts a current approximately proportional to the square of the difference between the cell's control gate voltage and threshold voltage. Each column line of the array is connected to the drains of every cell in a corresponding column of the array and conducts a total current which is the sum of the currents through the cells in that column. The current in a column line is thus proportional to the sum of the squares of the differences between the components of the input vector and the components of the stored vector (i.e. the square of the distance between the input vector and the stored vector).

One embodiment of this invention converts the column line currents to analog output voltages which indicate the distances between the input vector and the stored vectors. Another embodiment of this invention generates an index signal indicating the column that has the lowest current and therefore indicating the closest stored vector. Another embodiment of the invention generates an index signal and an analog voltage indicating the column with the lowest current and the magnitude of the current in that column. Still another embodiment of the invention provides a single analog voltage proportional to the lowest column current. Another embodiment of the invention offsets reciprocal voltage to create a range of input voltages which cause no current in a column.

Embodiments of this invention permit parallel comparison of an input vector to many stored vectors. Since a typical distance measuring array may contain hundreds of columns, each storing a vector, distance measuring circuits in accordance with this invention permit massive parallelism and very fast comparison of an input vector and a large library of stored vectors. Additionally, distance measuring circuits use well known analog memory cell technology which is relatively simple and compact, thereby providing a low cost. The distance measuring circuits store vectors in programmable non-volatile storage cells such as EEPROM cells and so have the versatility required for applications having a fixed library of vectors and applications programmed at a user's discretion.

BRIEF DESCRIPTION OF DRAWINGS

Use of the same reference symbols in different figures indicates similar or identical items.

DETAILED DESCRIPTION OF A PREFERRED EMBODIMENT

Figure 1:
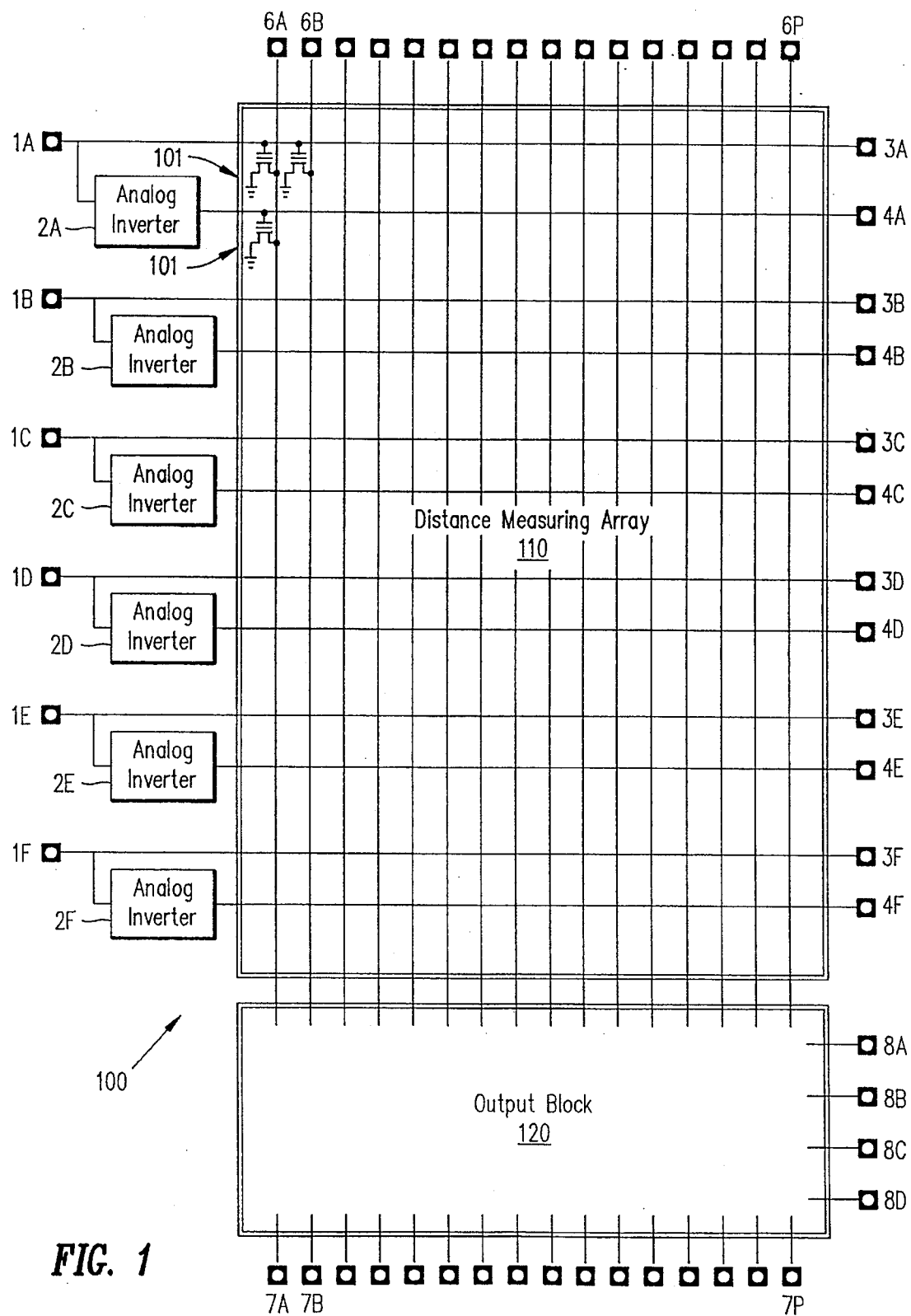
FIG. 1 is a block diagram of a distance measuring circuit according to an embodiment of this invention.

FIG. 1 shows an illustrative embodiment of an analog vector distance measuring circuit 100 according to this invention. Distance measuring circuit 100 includes an array 110 of analog non-volatile floating-gate storage cells 101. In FIG. 1, only representative cells 101 are illustrated. In an actual distance measuring array, an analog non-volatile floating-gate storage cell 101 is located at each intersection of column lines 6A to 6P with row lines 3A to 3F and 4A to 4F. Analog inverters 2A to 2F couple to row lines 4A to 4F, and an output block 120 couples to column lines 6A to 6P.

Distance measuring array 110 has twelve rows and sixteen columns. An array of this size can compare an input vector having six components to sixteen stored vectors, each stored vector having six components. In other embodiments, additional rows of cells may be added for vectors with more components, and addition columns may be added to increase the number of stored vectors and the number of simultaneous comparisons performed. A more typical distance measuring array may contain forty rows for an input vector having twenty components, and 250 columns for 250 stored vectors each having twenty components. Although FIG. 1 shows a single output block 120, alternative embodiments contain several output blocks one for each group of about sixteen to twenty stored vectors.

Array 110 is programmed to store vectors in the columns of cells 101. During programming, the cells to be programmed are selected via column lines 6A to 6P and row lines 3A to 3F and 4A to 4F. Conventional circuits (not show) send program and/or erase pulses through lines 3A to 3F, 4A to 4F, and 6A to 6P to program the cells' threshold voltages to desired analog levels. Many methods are known for programming analog threshold voltages in selected non-volatile floating-gate storage cells, such as EEPROM cells.

The particular method used to program the cells is not critical to this invention except that the method must provide the threshold voltage accuracy required by the application of distance measuring circuit 100. Typical applications require threshold voltages accurate to less than about 5% or ±0.15 volts in a 3-volt range of threshold voltages. More accurate threshold voltage programming, for example threshold voltages accurate to less than about 1% or 0.03 volts in a 3-volt range, can be achieved with current analog storage cells and provides more accurate distance measurements.

Each pair of row lines (3A,4A) to (3F,4F) corresponds to a component of an input vector asserted to input terminals 1A to 1F of distance measuring array 110. The method for generating the input vector depends on the application of distance measuring circuit 100 and the physical quantity represented by the input vector. For example, an input vector representing a sound signal may have components which are frequency components of a sound signal. Such frequency components can be generated by filtering the sound signal with band pass filters, a different band pass filter for each component, and then converting the output signals from the band pass filters to DC voltages representing the components of the input vector. Before being applied to inputs terminals 1A to 1F, the vector components are shifted and scaled to a desired range described below.

The threshold voltages of cells coupled to row lines 3A to 3F are programmed to levels linearly related to the corresponding components of stored vectors. The cells coupled to row lines 4A to 4F are programmed to threshold voltages linearly related to the negatives of corresponding components of the stored vectors. Typically, the same linear relation is used for all cells. The threshold voltages of cells coupled to row lines 4A to 4F are referred to as reciprocal threshold voltages. A reciprocal threshold voltage is derived from the negative of a vector component but is generally not the negative of the threshold voltage derived from the component.

In a typical analog storage array 110 where cells 101 are EEPROM cells, each cell has a programmable threshold voltage Vt within a range from a minimum voltage Vmin of about −1 volt to a maximum voltage Vmax of about 2 volts. The actual range Vmin to Vmax depends on the cell structure and the programming process. The programming range may also be limited to decrease charge leakage and improve the useful life of storage cells 101. The programming range of threshold voltages Vmin to Vmax corresponds to the range of values of vector components from a minimum Xmin to a maximum Xmax. A linear relationship between a component Xs of a stored vector and the threshold voltage Vt of a cell coupled to one of row lines 3A to 3F may be defined as follows.

$$Vt = Vmin + (Xs - Xmin) \cdot (Rvt/Rx) \quad \text{(eq. 1)}$$

where Rvt is the size of the range of threshold voltages (Rvt=Vmax−Vmin) and Rx is the size of the range of vector components (Rx=Xmax−Xmin).

Each cell coupled to row lines 4A to 4F can be programmed to a reciprocal threshold voltage Vtr which is linearly related to the negative −Xs of component Xs as follows.

$$\begin{aligned} Vtr &= Vmax + (Xmin - Xs) \cdot (Rvt/Rx) \quad \text{(eq. 2)} \\ &= 2 \cdot AGND - Vt \end{aligned}$$

where AGND is referred to as the analog ground voltage level and equals the midpoint of the threshold voltage range (AGND=(Vmax+Vmin)/2).

During distance measurement, analog input voltages Vi are applied to terminals 1A to 1F. The input analog voltages Vi linearly depend on the input vector's components Xi and satisfy a relation similar to eq. 1 as follows in eq. 3.

$$Vi = Vmin + (Xi - Xmin) \cdot (Rvt/Rx) \qquad \text{(eq. 3)}$$

Row lines 3A to 3F of array 110 receive input voltages Vi from input terminals 1A to 1F respectively. Each programmed cell coupled to one of row lines 3A to 3F has a threshold voltage linearly related to a component Xs of a stored vector and conducts when the corresponding component Xi of the input vector is greater than the component Xs, but does not conduct otherwise.

Analog inverters 2A to 2F receive input voltages Vi and generate reciprocal voltages Vir which are asserted to row lines 4A to 4F. Each reciprocal voltage Vir is linearly related to the negative of a corresponding vector component Xi and satisfies a relation similar to eq. 2 as shown in eq. 4.

$$\begin{aligned} Vir &= Vmax + (Xmin - Xi) \cdot (Rvt/Rx) \\ &= 2 \cdot AGND - Vi \end{aligned} \qquad \text{(eq. 4)}$$

Each programmed cell coupled to one of row lines 4A to 4F has a threshold voltage Vtr linearly related to the negative of a stored vector's component Xs and conducts when the corresponding component Xi of the input vector is less than the component Xs of the stored vector. The linear relationships between vector component Xi and the input voltages Vi and Vir, and between vector component Xs and the stored threshold voltages Vt and Vtr require that an input voltage Vi is greater than the threshold voltage Vt, if and only if the reciprocal voltage Vir is less than the corresponding reciprocal threshold voltage Vtr. Accordingly, unless the input voltage Vi exactly equals the stored threshold voltage Vt, exactly one cell in each column, per pair of row lines (3A,4A) to (3F,4F) conducts.

Each column line 6A to 6P carries a current which is the sum of the currents through all of the conducting cells in a corresponding column. Output block 120 supplies and measures the current to each column line 6A to 6P. Current-to-voltage converters in output block 120 generate on output terminals 7A to 7P, analog voltages proportional to the currents in column lines 6A to 6P and therefore proportional to the distances between the input vector and the stored vectors. Output block 120 provides on output terminals 8A to 8D a 4-bit digital signal indicating which of the sixteen column lines 6A to 6P conducts the least current.

Figure 2:
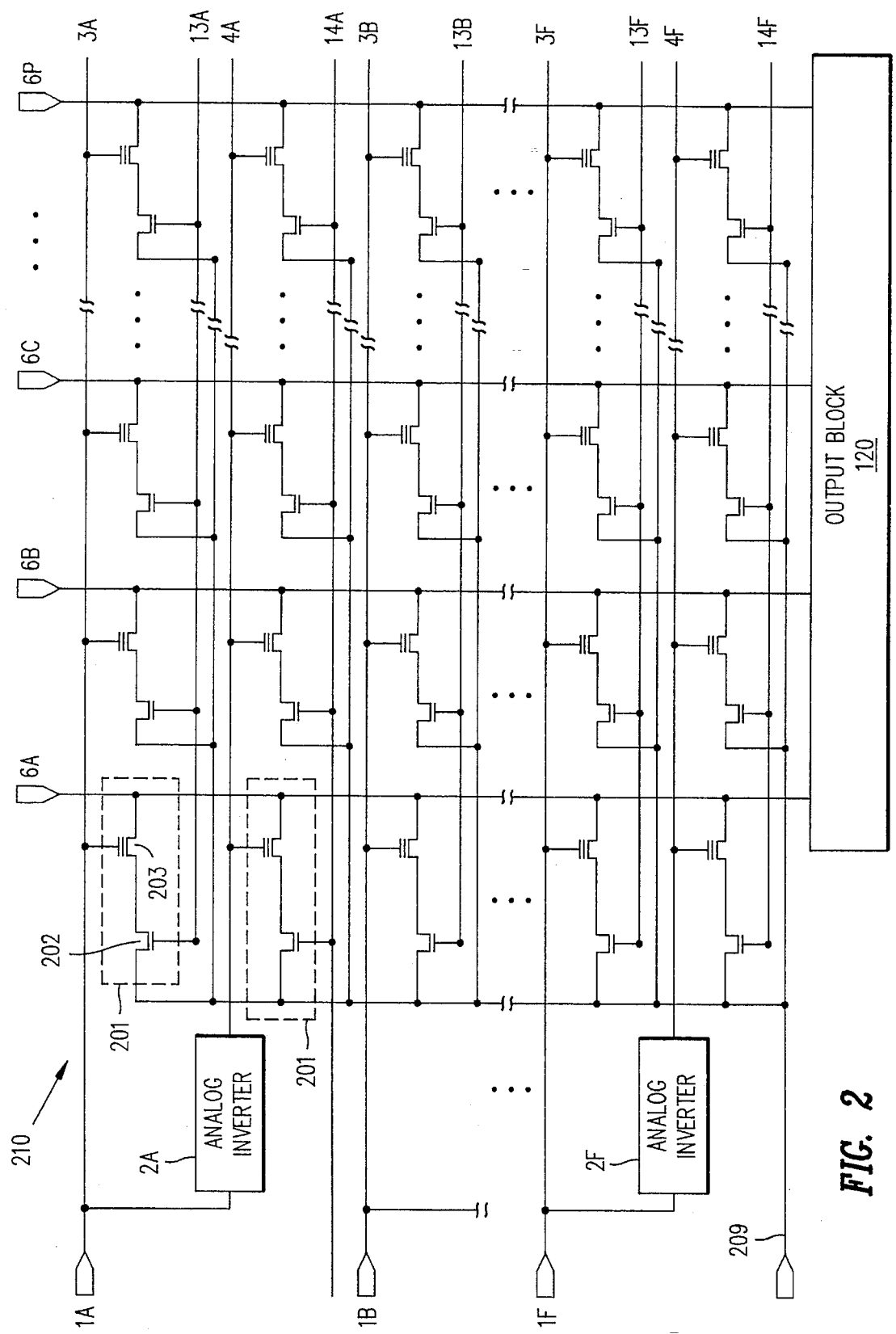
FIG. 2 is a schematic diagram of a distance measuring circuit according to another embodiment of this invention.

FIG. 2 shows an analog vector distance measuring array 210 according to another embodiment of this invention. Array 210 contains column lines 6A to 6P and rows lines 3A to 3F and 4A to 4F. At the intersections of the column and row lines are analog non-volatile floating-gate storage cells 201. Storage cells 201 are two transistor EEPROM cells containing a field effect transistor (FET) 202 and a floating gate transistor 203, but alternative embodiments may include single transistor memory cells, split gate memory cells, multiple transistor memory cells, EEPROM cells, EPROM cells, flash EPROM cells, or any cells which have threshold voltages programmable to the required accuracy.

EEPROM cells 201 have control gates of transistors 203 coupled to row lines 3A to 3F and 4A to 4F and select gates of transistors 202 coupled to select lines 13A to 13F and 14A to 14F. Similar arrays of EEPROM cells used as analog memory are commercially available from a variety of sources. For distance measurement, all select lines 13A to 13F and 14A to 14F of array 210 are at a high voltage, typically Vcc, so that whether a particular cell 201 conducts depends only on the control gate voltage and the programmed threshold voltage of the floating gate transistor 203 in that cell.

Source terminals of storage cell 201 are connected to a source line 209 which during distance measurements is connected to ground. Drains of storage cells 201 in each column are tied together and connected to output block 120 via column lines 6A to 6P. During distance measurement, output block 120 applies a voltage to column lines 6A to 6P that biases cells 201 in the saturation region. The saturation drain-source current IDS flowing through each cell corresponds closely to the following equation.

$$IDS = \frac{\mu C_{ox}(E_c)\Gamma^2 (V_G - V_T)^2}{2L[\Gamma(V_G - T_T) + (L)(E_c)]}$$

Where $\mu$ is the charge mobility, Cox is the total control gate capacitance, L is the effective channel length of a cell, $E_C$ is the critical electric field, $\Gamma$ is the gate coupling ratio between the cell's control gate and the floating gate, $V_G$ is the cell's control gate voltage, and $V_T$ is the cell's threshold voltage as measured at the control gate.

For large channel length L, current IDS is approximately proportional to the square of the voltage difference ($V_G - V_T$). Typically, the required effective channel length L is on the order of 1 micron or larger to assure that the current through each cell is approximately proportional to ($V_G - V_T$)$^2$. Making $\Gamma$ small undesirably damages cell performance by increasing program and erase times. The current drawn on each column line 6A to 6P is proportional to the sum of the squares of voltage differences $V_G - V_T$. Since the square of the Euclidean distance between two vectors equals the sum of the squares of each component distance, the current drawn by each column is proportional to the square of the Euclidean distance between the input vector and the vector stored in that column.

Figure 3:
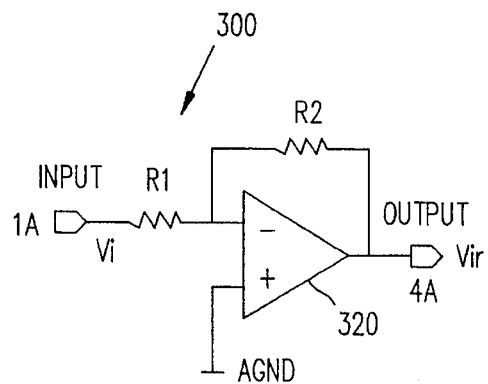
FIG. 3 is a schematic diagram of an analog inverter.

FIG. 3 shows an embodiment of an analog inverter 300 coupled to input terminal 1A and row line 4A. Analog inverter 300 is a unity gain inverting amplifier consisting primarily of a high gain differential input operational amplifier 320 and a feedback network containing resistors R1 and R2. Operational amplifier 320 has an inverting input terminal and a non-inverting input terminal. The non-inverting input terminal is connected to analog ground reference voltage AGND which is (Vmax+Vmin)/2, the center of the range of input voltages. A voltage divider (not shown) or other conventional means may be used to generate analog ground reference voltage AGND.

The inverting input of amplifier 320 is connected through a resistor R1 to input terminal 1A and through a resistor R2 to row line 4A. Setting the resistance of resistor R1 equal to the resistance of resistor R2 causes the output voltage of amplifier 320 to be the reciprocal voltage Vir of input voltage Vi given in eq. 4 (Vir=2·AGND−Vi).

Figure 4:
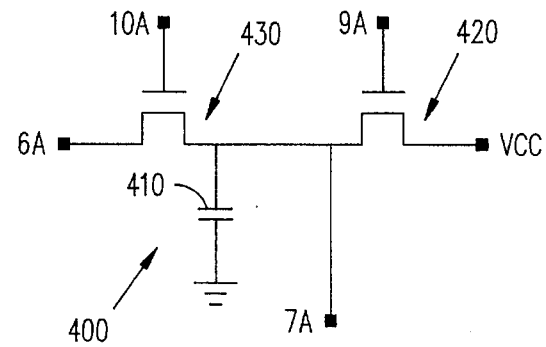
FIG. 4 is a schematic diagram of a current-to-voltage converter usable in an embodiment of the output block shown in FIGS. 1 and 2.

FIG. 4 shows an embodiment of a current-to-voltage converter 400 which connects to column line 6A and converts the current on column line 6A to a voltage which indicates the current. Output block 120 of FIGS. 1 and 2 would typically contain sixteen converters such as converter 400, one for each column line 6A to 6P. Converter 400 provides a voltage on output terminal 7A which is linearly related to the current drawn on column line 6A.

Before each distance measurement, a transistor 420 turns on and precharges a capacitor 410 to supply voltage Vcc. While input voltages Vi are asserted to terminals 1A to 1F, transistor 420 is turned off, and a transistor 430 is turned on. Transistor 430 connects capacitor 410 to column line 6A which draws current from capacitor 410 through the conducting cells connected to column line 6A. Transistor 430 is left on for a predetermined time T0 and then turned off. Time T0 and the size of capacitor 410 are chosen so that analog cells in array 110 conduct the saturation current during time T0. The capacitance of capacitor 410 must be high enough, and time T0 must be short enough that the voltage on capacitor 410 keeps the non-volatile analog storage cells operating in the saturation region even during the highest possible column current. After time T0, transistor 430 is turned off, and transistor 420 remains off. The difference between the voltage on output terminal 7A and supply voltage VCC is proportional to the current drawn from the column, and thus proportional to the square of the distance between the input vector and the vector stored in the column connected to column line 6A. An analog inverter can invert the voltage on terminal 7A to provide a voltage that decreases proportionally with the current on column line 6A.

FIGS. 5A, 5B, 5C, and 5D show a circuit that generates an index signal indicating which of sixteen column lines has the lowest current. The circuit scans sixteen input voltages V0 to V15 and determines which voltage V0 to V15 is lowest. Voltages V0 to V15 can be supplied by sixteen analog inverters and sixteen current-to-voltage converters, such as shown in FIG. 4, coupled to sixteen column lines of a distance measuring array. During scanning, an index indicating a column is changed as lower voltages are found. After all of voltages V0 to V15 have been scanned, the index signal is asserted.

Figure 5A:
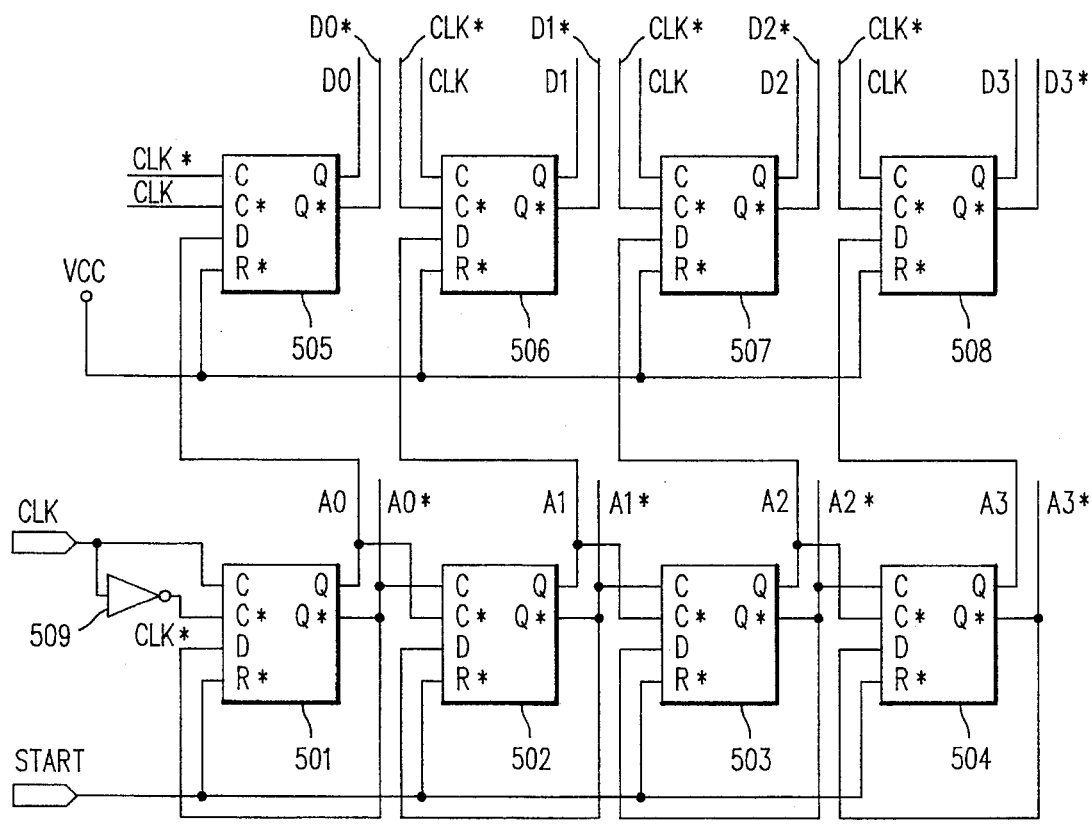
FIGS. 5A, 5B, 5C, and 5D are a schematic diagram of a circuit which is usable in the output block shown in FIGS. 1 and 2, to generate an index signal.

FIG. 5A shows a portion of the circuit containing four edge-triggered flip-flops 501 to 504 which form a 4-bit counter. When a signal START is high, a clock signal CLK and a complementary clock signal CLK* cause signals A3 to A0 from flip-flops 504 to 501 to increment from 0000 to 1111 binary (0 to 15 decimal). Flip-flops 501 to 504 also provide signals A0* to A3* which are complementary to signals A0 to A3. Clock signal CLK* triggers edge-triggered flip-flops 505 to 508 which provide signals D0 to D3 and D0* to D3*. Signals D0 to D3 and D0* to D3* respectively equal signals A0 to A3 and A0* to A3* delayed by a half clock period.

Figure 5B:
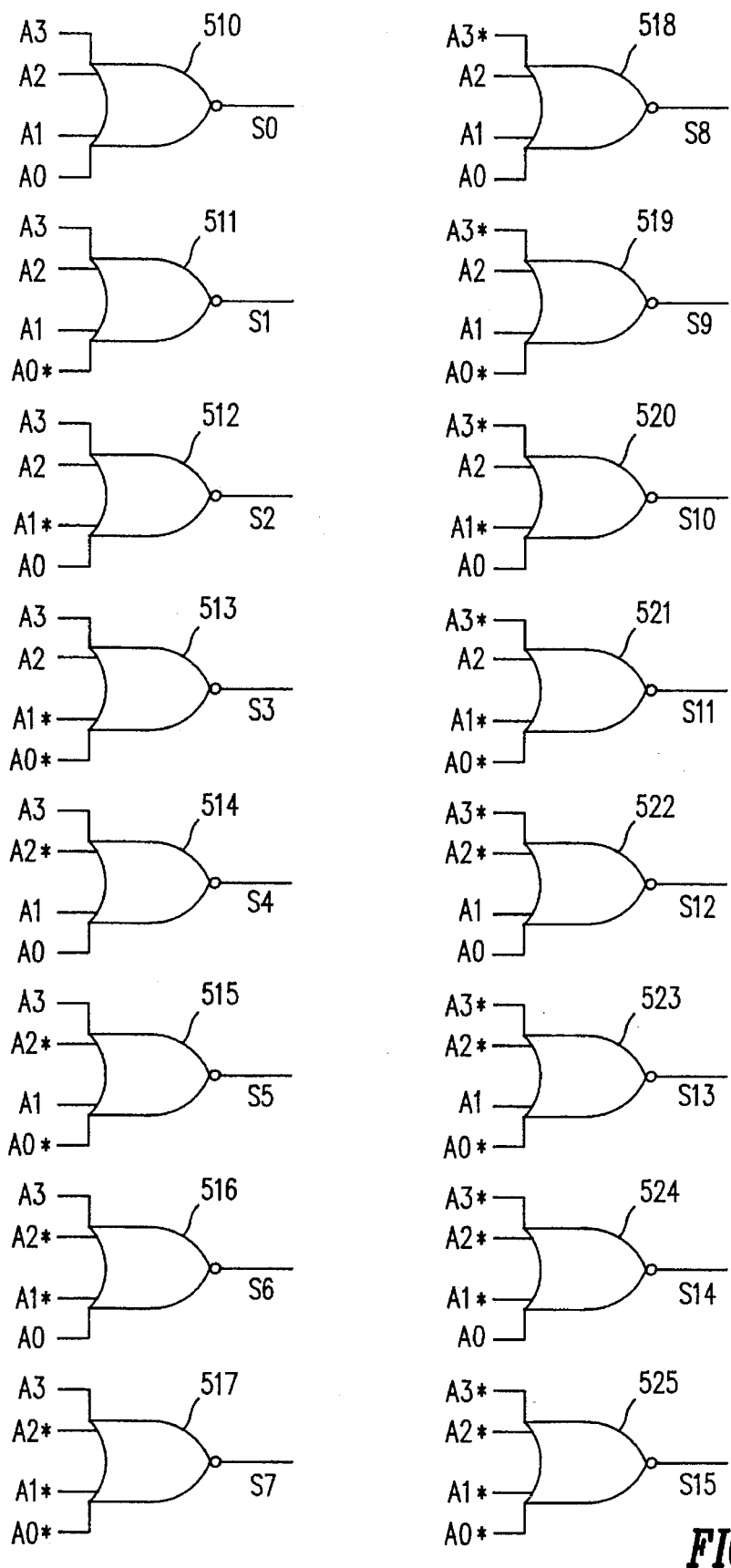
Figure 5C:
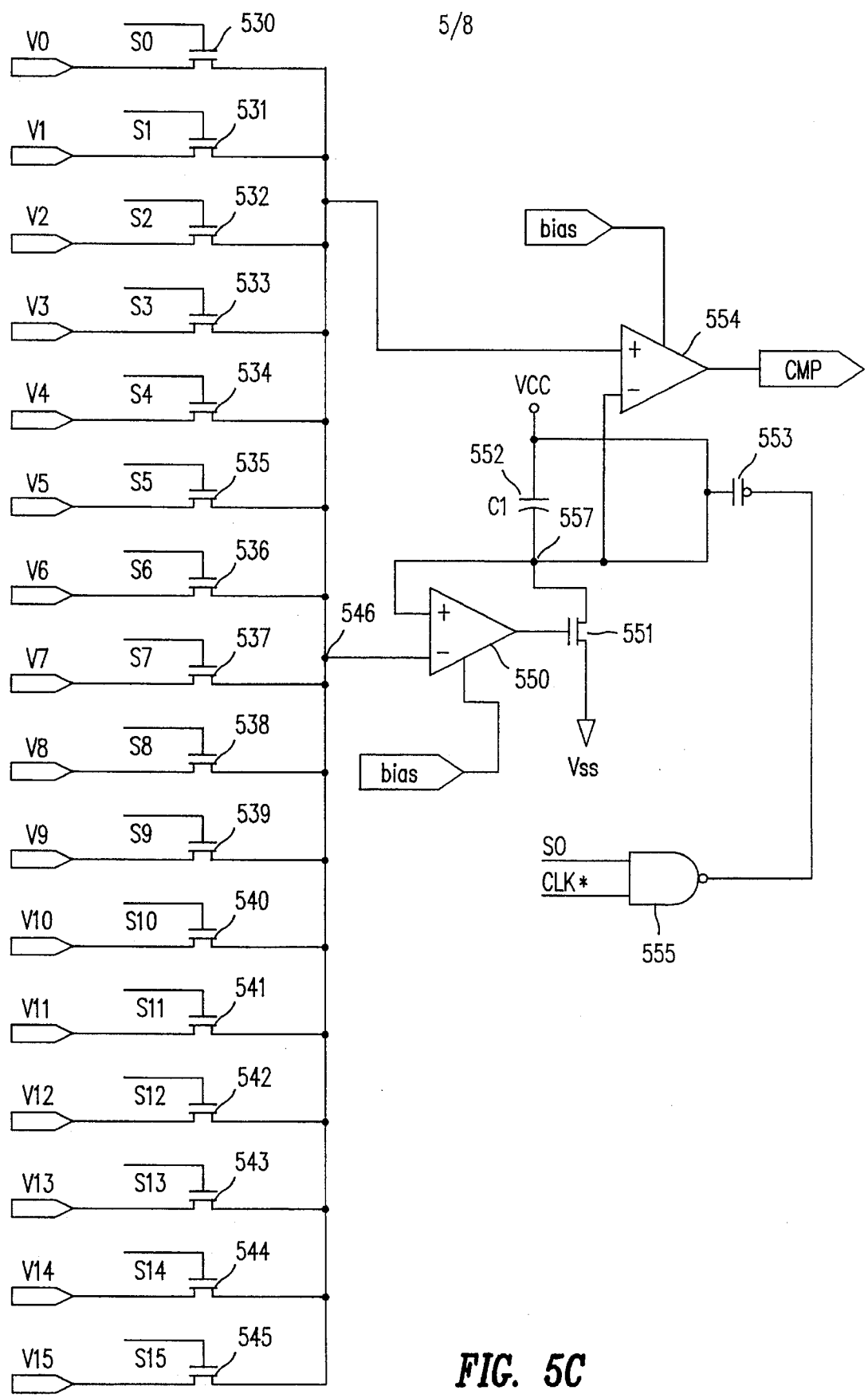

NOR gates 510 to 525 in FIG. 5B have output terminals coupled to the gates of N-channel transistors 530 to 545 (FIG. 5C) respectively and input terminals which receive combinations of signals A0 to A3 and A0* to A3*. As signals A0 to A3 increment from 0000 to 1111 binary, transistors 530 to 545 are sequentially turned on and connect a node 546 to voltages V0 to V15, one at a time.

During a first half of a first clock cycle of a scan, signals S0 and CLK* are high, and a P-channel transistor 553 charges a node 557 of capacitor 552 to voltage Vcc. A comparator 554 has a negative input terminal coupled to node 557 and a positive input terminal coupled to node 546 which is at voltage V0 during the first clock cycle. An output signal CMP from comparator 554 goes low to indicate that voltage V0 is lower than the voltage on node 557.

During the second half of the first clock cycle, signal CLK* is low and transistor 553 shuts off. A differential amplifier 550 has a positive input terminal coupled to node 557 and a negative input terminal coupled to node 546. An output voltage from amplifier 550 turns on an N-channel transistor 551 when the voltage at node 546 (initially V0) is less than the voltage on node 557 (initially Vcc). Transistor 551 connects node 557 to reference voltage Vss (ground), and the voltage on node 557 drops until the voltages on nodes 557 and 546 are equal. At that point, transistor 551 shuts off.

After the first clock cycle, signal S0 is low, and transistor 553 remains off while voltages V1 to V15 are scanned. Signal CMP is low when a voltage connected to node 546 is less than the voltage at node 557 and remains low while transistor 551 lowers the voltage at node 557 to the new lower level. Accordingly, the voltage at node 557 is at the lowest level of the previously scanned voltage.

Figure 5D:
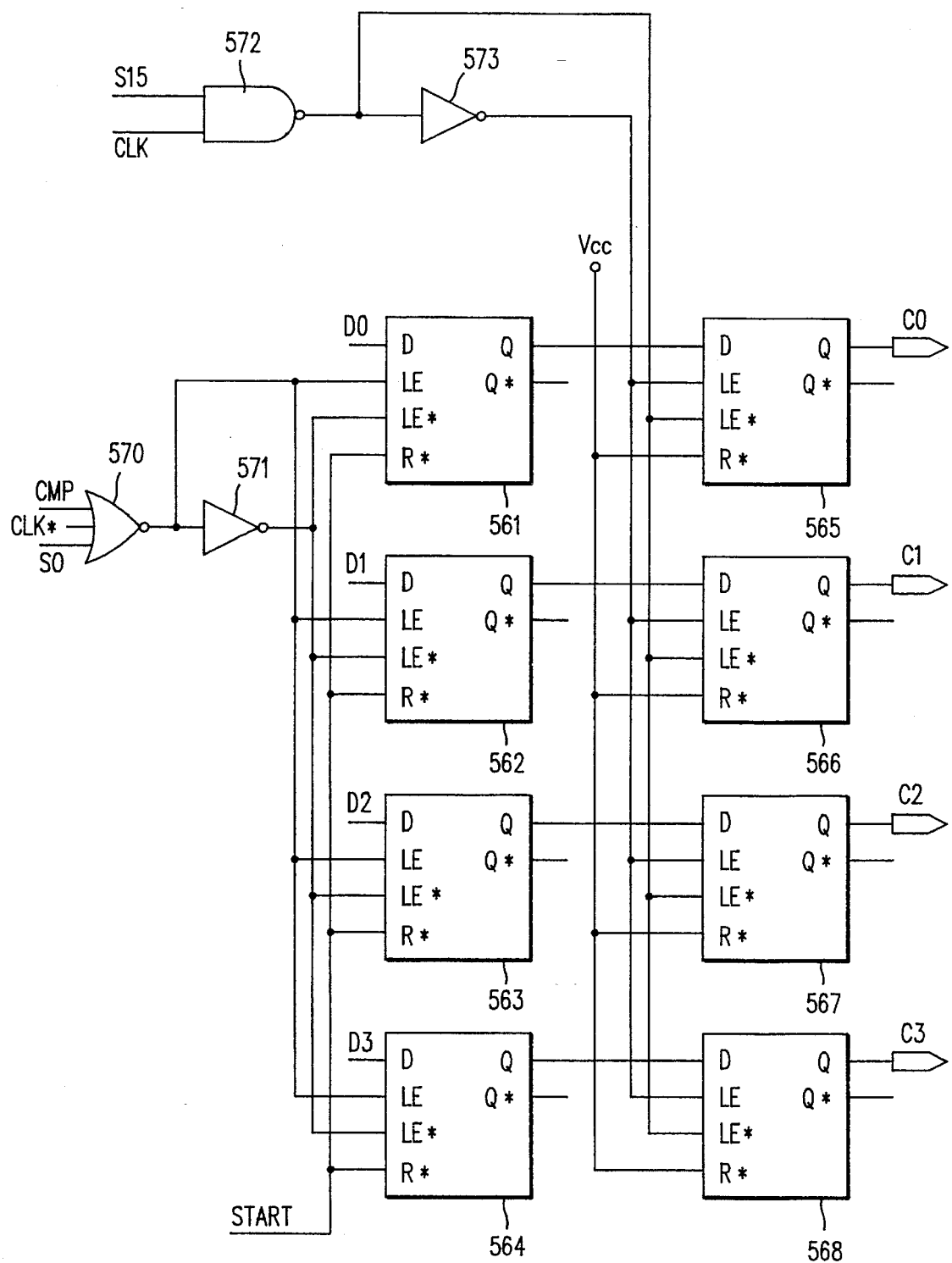

Latches 561 to 564 in FIG. 5D have data inputs coupled to receive signals D0 to D3 respectively from flip-flops 505 to 508 (FIG. 5A). A NOR gate 570 and an inverter 571 enable latches 561 to 564 when signals S0, CMP, and CLK* are low. When enabled, latches 561 to 564 load an index value indicated by signals D0 to D3. Initially, the index stored in latches 561 to 564 is zero, the index for voltage V0. During the first clock cycle of a scan, signal S0 is high and an output voltage from NOR gate 570 is low so that latches 561 to 564 maintain the initial index value. In subsequent clock cycles, signal S0 is low; and latches 561 to 564 load a new index whenever signal CMP is low indicating a new lower voltage and signal CLK* is low indicating the second half of a clock cycle.

During a final clock cycle of a scan, signal S15 is high; and a NAND gate 572 and an inverter 573 enable latches 565 to 568. Latches 565 to 568 transmit an index signal C0 to C3 indicating the index stored in latches 561 to 564.

One application of this invention is in vector quantization. Vector quantization replaces an input vector with a closely matched prototype vector from a library of prototype vectors and is performed to simplify mathematics, reduce data transmission bandwidth, or reduce storage requirements. For example, an input vector having sixteen 8-bit components can be replaced by an 8-bit index which indicates a prototype vector in a library of 256 prototype vectors. Using the index reduces bandwidth and storage requirements by a factor of sixteen. In real time signal processing, vector quantization can be a bottleneck for a system because determining the closest prototype vector from a large library is mathematically intensive. Distance measuring circuit 100 of FIG. 1 measures the required distances in parallel and thereby eliminates the bottle neck for real time applications.

The library of prototype vectors stored in circuit 100 is determined from training data, before vector quantization. The training data includes training vectors that are expected to be similar to the input vectors. Clusters of similar training vectors are usually found scattered across an n-dimensional vector space where n is the number of components in each vector. A conventional clustering algorithm such as the K-means algorithm or a splitting algorithm is applied to the training vectors to determine a library of prototype vectors which provides minimal distortion if used as substitutes for the training vectors. Selecting the library of prototype vectors can generally be done off-line by a separate system, since real time feed back is not required.

The user stores the library of prototype vectors in the columns of distance measuring array 110 and asserts a signal indicating an input vector on input terminals 1A to 1F. Distance measuring circuit 100 compares an input vector to all of the stored prototype vectors in the library simultaneously and then asserts on terminals 8A to 8D an index indicating the prototype vector which best matches the input vector. Distance measuring circuit 100 can relieve a vector quantization bottle neck because distances between the input vector and all vectors in the library are measured in parallel. Additionally, distance measuring circuit 100 is a low cost circuit when compared to digital processing because circuit 100 uses low cost analog storage rather digital memory for storing the library and a general purpose microprocessor or specialized digital logic for digital processing.

Providing both a distance and an index for the prototype vector closest to the input vector is important in some applications. For example, a speech recognition process known as word specific vector quantization requires an index of a prototype vector which best matches the input vector and a distance between the best prototype vector and the input vector. In word specific vector quantization, a set of words defines the vocabulary to be recognized, and a training data base is built for each word by sampling the sounds of speakers saying the words in the vocabulary. Each word is divided into a series of utterances each of which has spectral vectors that describe the sound of the utterance, and a time index which indicates the temporal location of the utterance in the word. Prototype spectral vectors for each utterance are determined by conventional clustering algorithms.

Figure 6:
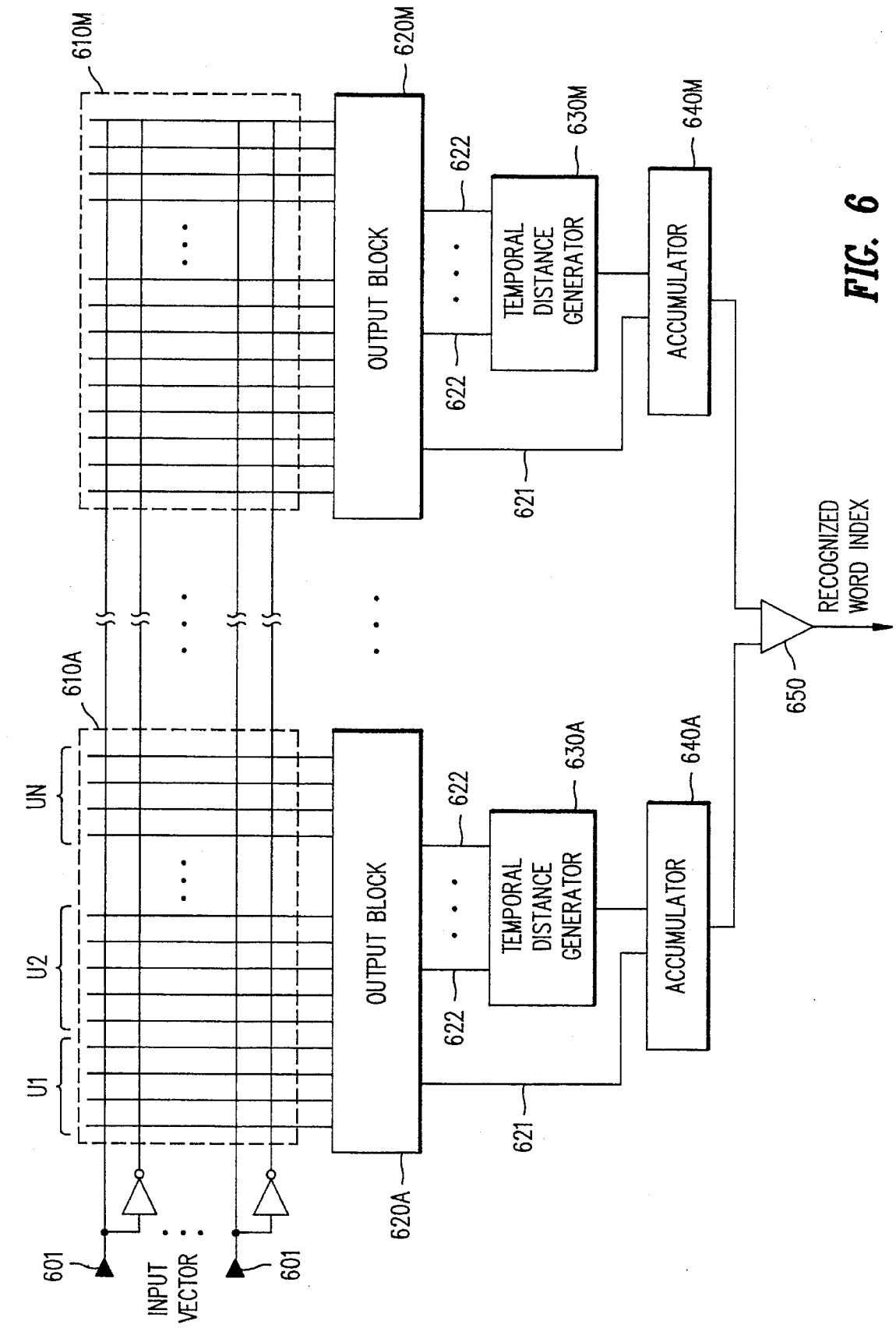
FIG. 6 is a block diagram of a voice recognition system in accordance with this invention.

In an embodiment of this invention shown in FIG. 6, a library of prototype vectors for each word is stored in one of several separate distance measuring arrays 610A to 610M which are similar to distance measuring arrays 110 (FIGS. 1 and 2). Array 610A contains a set of prototype spectral vectors for each utterance U1 to UN of a first word. The other arrays 620B to 620M contain prototype spectral vectors for other words in the vocabulary.

During speech recognition, a series of spectral vectors of input speech are applied to input terminals 601 of distance measuring arrays 610A to 610M. Each of output blocks 620A to 620M for arrays 610A to 610M respectively provides on a line 621 a voltage indicating the minimum distance, referred to as the spectral distance, between the input vector and the closest prototype vector in the attached one of arrays 610A to 610M and provides on lines 622 an index indicating the index of the closest prototype vector in that word. Temporal distance generators 630A to 630M determine temporal distances between when the utterances were detected and when the utterances were expected in the respective words. Temporal distance generators may derive values related to the temporal distances such as the negative log probability $-\ln(P)$. Accumulators 640A to 640M add the spectral distances to the values from the temporal distance generators for each input vector and keep a running sum of the combined temporal-spectral distances during the length of an input word. Typically, there is a series of 50 to 100 input vectors for each input word. At the end of the input word, a comparator 650 determines which word (i.e. which of accumulators 640A to 640M) has the lowest running sum, and provides an index indicating a word recognized as the closest match to the input word.

In an alternative to the embodiment shown in FIG. 6, a general purpose digital processor performs the functions of temporal distance generators 630A to 630M, accumulators 640A to 640M, and comparator 650.

Instead of the threshold voltages Vt and Vtr and input voltages Vi and Vir of eqs. 1 to 4, distance measuring circuits can use voltages Vt, Vtr, Vi, and Vir which have fixed offsets $\delta Vt$, $\delta Vtr$, $\delta Vi$ and $\delta Vir$ as in eqs. 5 to 8.

$$Vt = Vmin + (Xs - Xmin) \cdot (Rvt/Rx) + \delta Vt \qquad (eq. 5)$$

$$Vtr = Vmax + (Xmin - Xs) \cdot (Rvt/Rx) + \delta Vtr \qquad (eq. 6)$$

$$Vi = Vmin + (Xi - Xmin) \cdot (Rvt/Rx) + \delta Vi \qquad (eq. 7)$$

$$Vir = Vmax + (Xmin - Xi) \cdot (Rvt/Rx) + \delta Vir \qquad (eq. 8)$$

On average, a positive offset $\delta Vt$ or $\delta Vtr$ in the stored threshold voltages (or a negative offset $\delta Vi$ or $\delta Vir$ in the input voltages) has the advantage of reducing the current during a distance measurement. A negative offset $\delta Vt$ or $\delta Vtr$ (or a positive offset $\delta Vi$ or $\delta Vir$ in the input voltages) has the disadvantage of increasing the current drawn during a distance measurement.

The set of vectors which cause a given current in a column depends on the offsets $\delta Vt$, $\delta Vtr$, $\delta Vi$ and $\delta Vir$. For example, a positive offset $\delta Vtr$ in the reciprocal threshold voltages Vtr in a column creates a range of input vectors, with input voltages Vi in a range Vt−$\delta Vtr$<Vi<Vt, which causes essentially no current in the column. In contrast, with zero offsets, only one vector, the vector equal to the stored vector, causes no current.

Using offsets has a number of applications. Offsets allow a distance measuring array to identify input vectors within a range of vectors that provide zero current. Different offsets can be used for different components so that the range of vectors causing no current can be tailored to a desired range. Offsets also change the sets of vectors corresponding to a non-zero measured currents in a column line. In some vector quantization and pattern matching applications, the sets distinguished using offsets result in more accurate classification of input vectors. For example, one or more signal representing components of an input vector may have large error, and increasing the stored threshold voltage Vt and Vtr (or decreasing input voltages Vi and Vir) for that component reduces the relative significance of the less accurate component.

Offsets can also account for the scatter of training vectors used to determine the stored library of prototype vectors. Typically, training vectors are clustered into groups assigned to prototype vectors which characterizes the group. The training vectors within the group assigned to a particular prototype vector are scattered, and that scatter is normally expressed by a term $\sigma_{ij}$, where i and j respectively indicate indices of a prototype vector and a component.

When distances between the prototype vector and the input vectors are calculated, the squared difference for each component can be divided by the corresponding $\sigma_{ij}$ so that poorly measured or randomly varying components do not dominate the distance measurement and cause poor pattern matching. Many systems do not perform such division because the added mathematical complexity typically slows computation or requires additional circuitry. Offsetting the threshold voltages does not divide the components by $\sigma$ but does reduces the relative significance of components with high $\sigma$ without slowing computation or increasing chip size.

Figure 7:
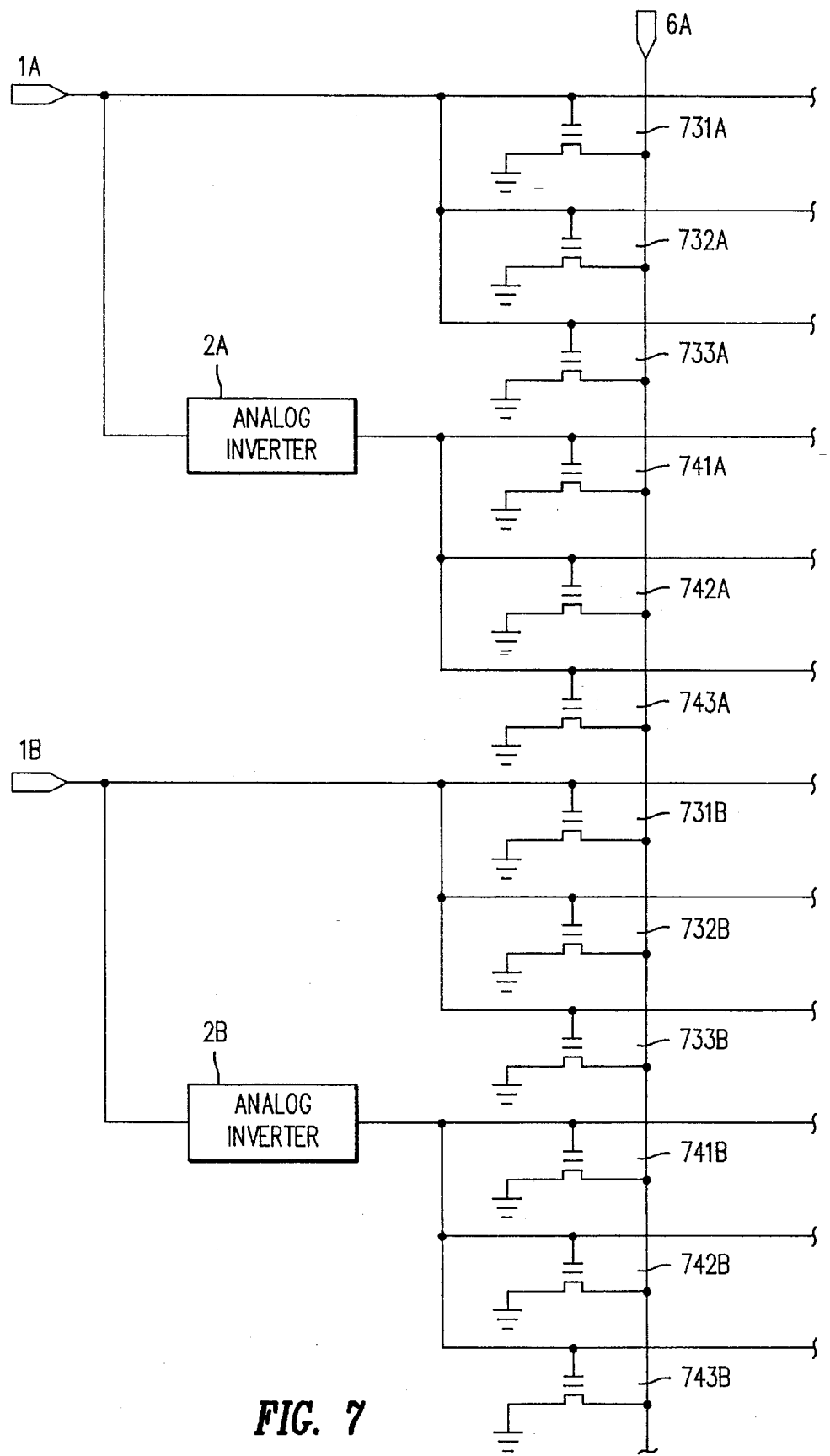
FIG. 7 is a diagram of a column of a distance measuring array in accordance with an embodiment of this invention.

A division by $\sigma_{ij}$ can be implemented by assigning several storage cells to each component of a prototype vector. FIG. 7 shows an example column in a distance measuring array where two sets of three storage cells {731A, 732A, 733A} and {741A, 742A, 743A} in the column are assigned to a first component of a prototype vector stored in the column, and two other sets of three storage cells {731B, 732B, 733B} and {741B, 742B, 743B} are assigned to a second component. Each set {731A, 732A, 733A}, {741A, 742A, 743A}, {731B, 732B, 733B}, and {741B, 742B, 743B} contains cells with effective channel widths 1 µm, 2 µm, and 4 µm. More generally, the number of cells assigned to each component depends on the accuracy required for the division, and the cells in a column can all have the same channel widths.

If a component of a prototype vector had a very low $\sigma$, all or most of the cells assigned to that component of that prototype vector can be programmed normally as disclosed above. If a component has a very high $\sigma$, few or none of the cells are programmed normally; most or all are programmed to a very high level so that the cells do not conduct during distance measurement. Accordingly, components with low σ have more conducting cells than do components with higher σ. For example, if the first component has a σ seven time higher than the σ for the second component, cells 731B, 732B, and 733B are programmed to the threshold voltage Vt corresponding to the second component, and cells 741B, 742B, and 743B are programmed to the reciprocal voltage Vtr corresponding to the second component. The first component has cells 731A and 741A, the cells with effective channel width 1 μm, programmed respectively to the threshold voltage Vt and reciprocal threshold voltage Vtr corresponding to the first component. The remaining cells corresponding to the first component, cells 732A, 733A, 742A, and 743A, are programmed to a high threshold voltage (Vmax or higher) so that cells 732A, 733A, 742A, and 743A do not conduct during distance measurement. During a distance measurement, the current contribution corresponding to the second component is weighted by a factor of seven relative to the contribution corresponding to the first component because the effective channel width of conducting cells for the second component is seven times the effective channel width of conducting cells of the first component. A disadvantage of the embodiment of FIG. 7 is the increase in the number of cells.

The above embodiments describe vectors stored in a single column of an array. Alternatively, a stored vector can be split among two or more columns. For example, instead of assigning multiple cells in a column to one component as in FIG. 7, multiple cells in a row can be assigned a component of a vector. Different columns can contain cells with different effective channel widths, and the currents in columns containing the stored vector are combined to provide a measurement of the distance between the input vector and the stored vector.

In one embodiment of the invention, cells in a first column of an array are programmed to threshold voltages Vt linearly related to the components of a stored vector, and cells in a second column of the array are programmed to the reciprocal threshold voltages Vtr. In a first cycle of a distance measurement, voltages linearly related to the components of an input vector are asserted to the row lines, and the current in the first column is measured. In a second cycle of the distance measurement, voltages linearly related to the negatives of the components of the input vector are asserted to the row lines, and the current in the second column is measured. The measured currents from the two cycles are combine to determine a distance.

Although the present invention has been described with reference to particular embodiments, the description is only an example of the invention's application and should not be taken as a limitation. In particular, even though much of preceding discussion was aimed at analog storage arrays, alternative embodiments of this invention include arrays having multi-level digital storage cells where the possible input voltages or threshold voltages of a cell have discrete levels. Various other applications, adaptations, and combinations of features of the embodiments disclosed will be apparent to those skilled in the art and are within the scope of the present invention as defined by the following claims.

I claim:

1. A distance measuring circuit comprising:

an array of analog storage cells arranged in rows and columns;

row lines, each coupled to control gates of a row of the analog storage cells;

column lines, each coupled to current carrying terminals of a column of analog storage cells;

an input circuit which simultaneously applies to the row lines, parallel analog voltages which depend on the components of an input vector; and an output block coupled to the column lines, wherein the output block measures magnitudes of currents to the column lines.

2. The distance measuring circuit of claim 1, wherein the input circuit comprises a plurality of analog inverters, each of the analog inverters having a corresponding pair of row lines in the array, wherein each analog inverter has an input terminal coupled to a first row line of the corresponding pair and an output terminal coupled to a second row line of the corresponding pair.

3. The distance measuring circuit of claim 2, further comprising means for simultaneously applying to the input terminals of the analog inverters, analog signals indicating components of the input vector.

4. The distance measuring circuit of claim 1, wherein the output block comprises a plurality of current-to-voltage converters, each of the current-to-voltage converters being coupled to a corresponding one of the column lines and generating a voltage which indicates a magnitude of the current on the column line.

5. The distance measuring circuit of claim 4, wherein each of the current-to-voltage converters comprises:

a capacitor;

a first transistor coupled between a terminal of the capacitor and a column line corresponding to the current-to-voltage converter;

a second transistor coupled between the terminal of the capacitor and voltage supply; and an output terminal coupled to the terminal of the capacitor.

6. The distance measuring circuit of claim 1, wherein the output block comprises a circuit that generates a signal indicating which of the column lines carries least current.

7. The distance measuring circuit of claim 1, wherein the output block comprises a circuit which senses currents on each of the column lines and generates a signal indicating a minimum of the currents on the column lines.

8. A method for determining the distance between a first vector and a second vector, comprising:

programming a first set of storage cells in a column to have threshold voltages which depend linearly on components of the first vector;

asserting to the control gates of the first set of storage cells voltages which depend linearly on components of the second vector;

applying voltages to current carrying terminals of the first set of storage cells to create a current in those of the first set of storage cells that conduct when the first set of voltages is asserted; and measuring a sum of currents including currents through the first set of storage cells.

9. The method of claim 8, further comprising:

programming a second set of storage cells in the column to have threshold voltages which depend linearly on negatives of the components of the first vector;

asserting to the control gates of the second set of storage cells voltages which depend linearly on negatives of the components of the second vector; and applying voltages to current carrying terminals of the second set of storage cells to create a current in those of the second set of storage cells that conduct.

10. The method of claim 9, wherein:

asserting voltages comprises simultaneously asserting voltages to the control gates of the first and the second sets of storage cells; and measuring the sum of currents further comprises measuring a sum of currents including currents through the first and the second sets of storage cells.

11. The method of claim 10, wherein applying voltages to current carrying terminals of the first set of storage cells comprises biasing each storage cell in its saturation region.

12. The method of claim 8, wherein applying voltages to current carrying terminals of the first set of storage cells comprises biasing each storage cell in its saturation region.

13. The method of claim 8, wherein:

programming the first set of storage cells further comprises programming a first cell and a second cell to the same threshold voltages; and asserting voltages to the control gates of the first set of storage cells further comprises applying the same voltage to control gates of the first and second cells.

14. The method of claim 13, further comprising programming a threshold voltage of a storage cell in the column to level higher than any of the voltages asserted to the control gates.

* * * * *